United States Patent
Chen et al.

(10) Patent No.: US 12,123,907 B2
(45) Date of Patent: Oct. 22, 2024

(54) DETECTING A VIA STRIPPING ISSUE IN A PRINTED CIRCUIT BOARD

(71) Applicant: Dell Products L.P., Round Rock, TX (US)

(72) Inventors: Ching-Huei Chen, Taoyuan (TW); Bhyrav Mutnury, Austin, TX (US); Chun-Lin Liao, Taipei (TW); Chi-Hsiang Hung, New Taipei (TW); Pei-Ju Lin, Taoyuan (TW)

(73) Assignee: Dell Products L.P., Round Rock, TX (US)

( * ) Notice: Subject to any disclaimer, the term of this patent is extended or adjusted under 35 U.S.C. 154(b) by 287 days.

(21) Appl. No.: 17/729,886

(22) Filed: Apr. 26, 2022

(65) Prior Publication Data

US 2023/0341458 A1 Oct. 26, 2023

(51) Int. Cl.
*G01R 31/28* (2006.01)
*G01R 1/02* (2006.01)
*G01R 1/04* (2006.01)
*G01R 1/067* (2006.01)
*G01R 1/07* (2006.01)
*G01R 27/26* (2006.01)
*G01R 31/08* (2020.01)

(52) U.S. Cl.
CPC .......... *G01R 31/2812* (2013.01); *G01R 1/07* (2013.01)

(58) Field of Classification Search
CPC . G01R 1/02; G01R 1/04; G01R 1/067; G01R 1/07; G01R 1/073; G01R 31/08; G01R 31/28; G01R 31/309; G01R 31/31; G01R 31/3187; G01R 27/26
See application file for complete search history.

(56) References Cited

U.S. PATENT DOCUMENTS

| | | | |
|---|---|---|---|
| 6,297,458 B1* | 10/2001 | McMillan | H05K 1/0268 174/250 |
| 7,676,920 B2 | 3/2010 | Farkas et al. | |
| 2012/0167386 A1 | 7/2012 | Goergen et al. | |
| 2015/0342057 A1* | 11/2015 | Bartley | H05K 3/429 408/2 |
| 2017/0265297 A1* | 9/2017 | Onishi | G01R 31/28 |

\* cited by examiner

*Primary Examiner* — Neel D Shah
(74) *Attorney, Agent, or Firm* — Larson Newman, LLP (57) ABSTRACT

A flying probe includes a test module and a processor. The test module measures a plurality of delta capacitances associated with a plurality of vias in a printed circuit board. The plurality of vias include first, second, third and fourth vias. Each different delta capacitance is measured between a different pair of the vias. The processor compares all the delta capacitances to a threshold value. In response to multiple delta capacitances associated with the first via being greater than or equal to the threshold value, the processor detects a possible via stripping issue for the first via.

20 Claims, 7 Drawing Sheets

DETECTING A VIA STRIPPING ISSUE IN A PRINTED CIRCUIT BOARD

FIELD OF THE DISCLOSURE

The present disclosure generally relates to information handling systems, and more particularly relates to detecting a via stripping issue in a printed circuit board.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

A flying probe includes a test module and a processor. The test module may measure a plurality of delta capacitances associated with a plurality of vias in a printed circuit board. The plurality of vias include first, second, third and fourth vias. Each different delta capacitance may be measured between a different pair of the vias. The processor may compare all the delta capacitances to a threshold value. In response to multiple delta capacitances associated with the first via being greater than or equal to the threshold value, the processor may detect a possible via stripping issue for the first via.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 7:
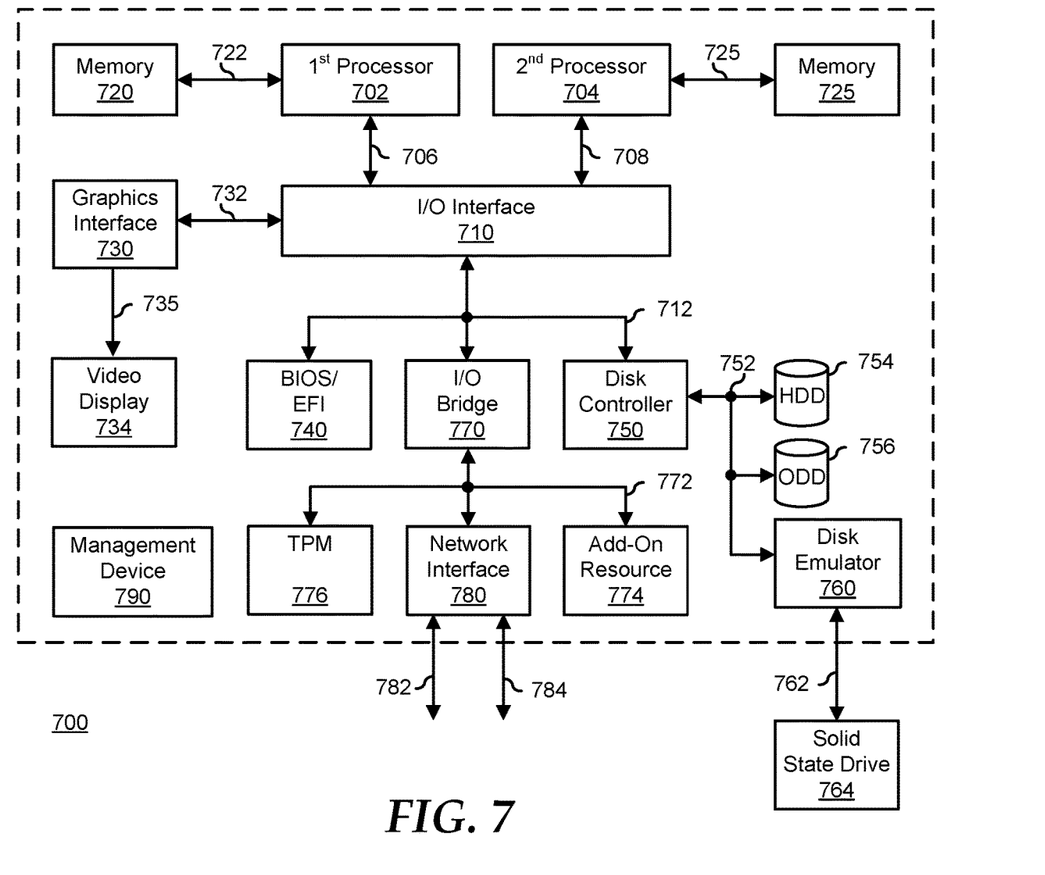
FIG. 7 is a block diagram of a general information handling system according to an embodiment of the present disclosure.

FIGS. 1-5 illustrate a printed circuit board (PCB) 100 of an information handling system, such as information handling system 700 of FIG. 7, according to according to at least one embodiment of the present disclosure. For purpose of this disclosure information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system can be a personal computer, a laptop computer, a smart phone, a tablet device or other consumer electronic device, a network server, a network storage device, a switch, a router, or another network communication device, or any other suitable device and may vary in size, shape, performance, functionality, and price.

PCB 100 includes multiple metal layers 110 and multiple insulating layers 112. In an example, adjacent metal layers 110 are separated by an insulating layer 112. In certain examples, metal layers 110 may be any combination of ground layers and signal layers. Metal layers 110 may be any suitable type of metal, such as copper, aluminum, silver, gold, zinc, and nickel. PCB 100 also includes any suitable number of vias. For brevity and clarity, PCB 100 will be described with respect to vias 114, 116, 118, and 120 even though the PCB may include additionally vias without varying from the scope of this disclosure. In certain examples, vias 114, 116, 118, and 120 may be any suitable type of vias including, but not limited to, blind vias to connect a layer on the surface of PCB 100 to a metal layer 110 within the PCB, buried vias to connect two interior metal layers 110, and through vias to connect two exterior layers.

Figure 1:
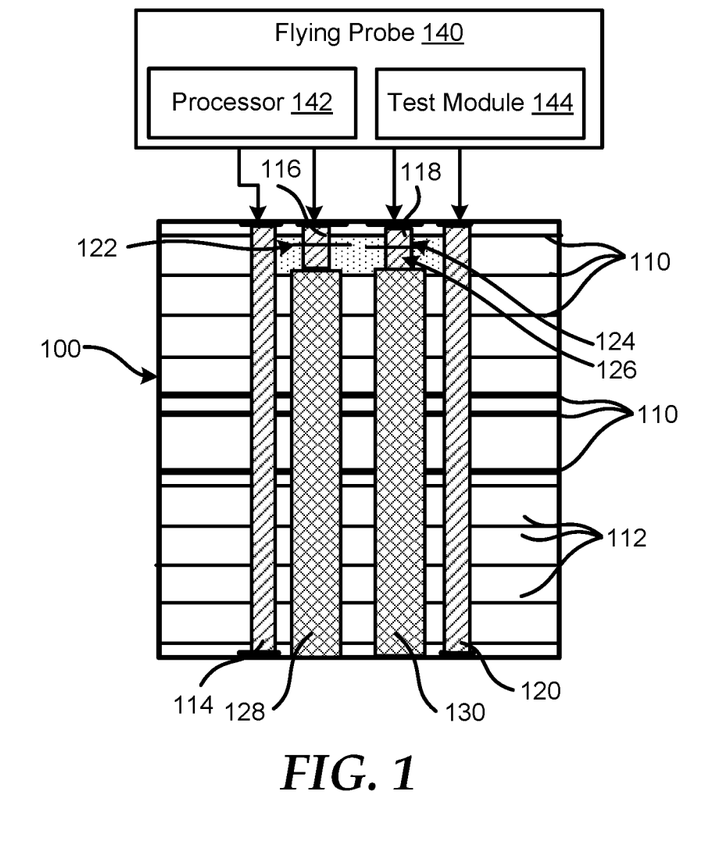
FIG. 1-5 are diagrams of different printed circuit boards each with multiple vias and multiple backdrill holes according to at least one embodiment of the present disclosure.
Figure 2:
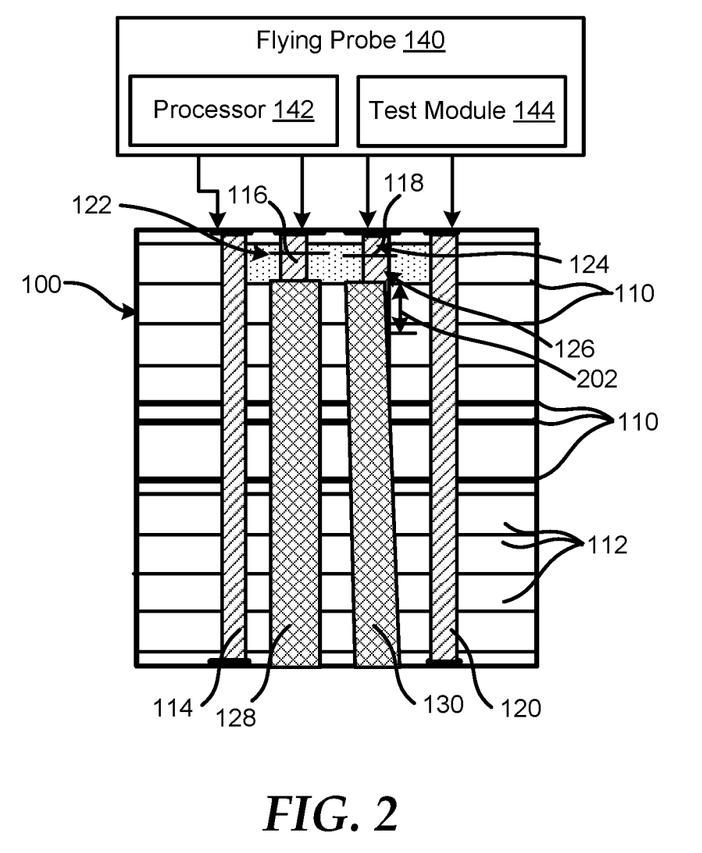
Figure 3:
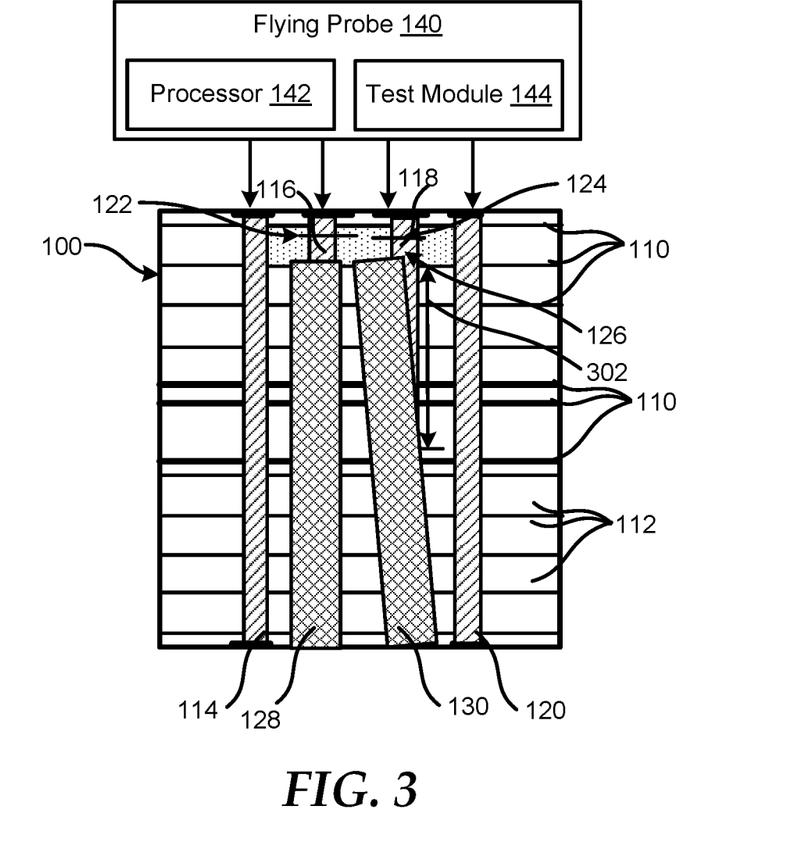

In an example, PCB 100 may be a bare metal PCB, such that the PCB does not include any through holes or components added to a surface of the PCB. A bare metal PCB may also include multiple vias, such as vias 114, 116, 118, and 120 to connect one or more metal layers 110 within PCB 100. As illustrated in FIGS. 1-5, vias 116 and 118 may connect with a component layer 122 or 422 (in FIGS. 4 and 5) within PCB 100. When vias 116 and 118 connect from a surface of PCB 100 to component layer 122 as shown in FIG. 1-3, a portion of each via between a first surface and the component layer may be referred to as a via barrel 124 and a portion of each via that extends beyond the component layer toward a second surface may be referred to as a via stub 126. In an example, as signal speeds continue to increase, small parasitic effects may begin to have a large impact on signal integrity (SI). For example, via stub 126 may adversely impact the SI of high speed signal within PCB 100.

In certain examples, a back drill process may be utilized to create back drilled holes 128 and 130 to remove or eliminate extra metal of the via, such as via stub 126, that extends beyond component layer 122. PCB 100 may include any suitable number of back drilled holes depending on the number of vias connecting and extending beyond a component layer of the PCB. For brevity and clarity, the back drill process will be described with respect to back drilled holes 128 and 130, but PCB 100 may include additional back drilled holes without varying from the scope of this disclosure. In an example, back drilled holes 128 and 130 may be utilized to only leave via stub 126 with a length that is less than 10 mils. One of ordinary skill in the art would recognize that mil is a unit of measurement utilized in routing on PCBs, and one mil equals one-thousandth of an inch or two hundred fifty four ten-thousandths of a millimeter.

Referring now to FIG. 2, during the back drilling process, the drilling of one or both of back drilled holes 128 and 130 may be misaligned based on the drill being mis-registered with respect to a perpendicular angle with a surface of PCB 100, or based upon the drill being off-center from the center of associated vias 116 or 118. In response to the mis-registration of the drill, a back drilled hole, such as back drilled hole 130 may not remove all of the metal plating of via 118, such that a residual metal 202 amount or length of the metal may remain on the via. In an example, the residual metal, such as copper, on via 118 in back drilled hole 130 may be referred to as via stripping. In certain examples, via striping from residual metal 202 may act as an additional length to via stub 126, which may greatly impact SI loss and impedance for high speed signals traveling along component layer 122 and via 118. The details of PCB manufacture, and particularly the forming of vias and back drilled holes in a PCB are known in the art and will not be further described herein, except as needed to illustrate the current embodiments.

Previous PCB manufacturing techniques are not able to properly detect whether a back drilled hole includes residual metal on the via. A current approach is to detect the residual metal reactively after an interface fails during the debug phase of the PCB. In this approach, micro-section analysis, which will damage the PCB, may sometimes find via stripping. However, if the PCB is not cross-sectioned in the right position using 2D-X-ray, a via stripping issue may not be detected because the cross-section may cut through the via stripping. Thus, manufacturing of PCB 100 may be improved by utilizing a flying probe 140, illustrated in FIGS. 1-5, to detect the via stripping caused by residual metal 202. For example, the manufacturing may be improved by flying probe 140 detecting possible via stripping with cross-sectioning PCB 100.

In an example, flying probe 140 may include one or more components, such as a processor 142 and a test module 144, illustrated in FIGS. 1-5, to perform any suitable number of tests and other operations to detect whether PCB 100 includes a possible stripping issue. In certain examples, operations described herein as being performed by flying probe 140 may be performed by processor 142, test module 144, or a combination of processor 142 and test module 144. In an example, flying probe 140 may be moved around PCB 100, such as an automatically operated two-axis system, and one or more test probes may contact components of the PCB, such as one or more of vias 114, 116, 118, and 120. While flying probe 140 is illustrated as having 4 test probes, the flying probe may include additional or less test probes without varying from the scope of this disclosure. In an example, flying probe 140 may determine open/short and resistance conditions within PCB 100. Flying probe 140, by test module 144, may detect capacitances on all vias having a same layer transition, such as component layer 122. In certain examples, a flying probe may detect a large range of capacitance, such as a capacitance as low as 20 femto-Farads (fF) and as high as 20 nano-Farads (nF). The details of utilizing a flying probe to detect capacitance are known in the art and will not be further described herein, except as needed to illustrate the current embodiments.

In an example, a different delta capacitance may be measured between different sets of vias. For example, a first delta capacitance may be measured between via 114 and via 116, a second delta capacitance may be measured between via 114 and via 118, a third delta capacitance may be measured between via 114 and via 120, a fourth delta capacitance may be measured between via 116 and via 118, a fifth delta capacitance may be measured between via 116 and via 120, and a sixth delta capacitance may be measured between via 118 and via 120.

In response to the delta capacitances being measure, processor 142 may determine whether one or more of the delta capacitances are above a threshold value. In an example, the threshold value may be any suitable capacitance including, but not limited to, 15 fF, 20 fF, 25 fF, and 30 fF. If at least one of the delta capacitances is above the threshold value, processor 142 of flying probe 140 may detect a potential via stripping issue within PCB 100, and any necessary action may performed for the via stripping. For example, one action may to perform the back drill process again on a via, such as via 118, that processor 142 detected may possibly have via stripping from residual metal 202 on via 118.

Referring now to FIGS. 2 and 3, in an exemplary non-limited embodiment, processor 142 of flying probe 140 may perform one or more suitable operations to determine whether via stripping may be located within PCB 100. In an example, capacitance values measured by test module 144 of flying probe 140 may be based on any suitable variables including, but not limited to, a dielectric constant (Dk/Df) of insulating layers 112, a length of via barrel 124, a length of via stub 126, a length of residual metal 202, a total thickness of PCB 100, a width of the vias, and a width of the back drilled holes. As used herein, Dk is the real part of the dielectric constant or the material relative permittivity, and Df is the imaginary part of the dielectric constant or the material loss tangent.

In FIG. 2, back drilled hole 130 may have an offset angle substantially equal to 1.5 degrees. In this exemplary embodiment, the threshold delta capacitance for detecting a possible stripping issue may be 20 fF. In this example, the dielectric constant (Dk/Df) for insulating layers 112 may be 3.2/0.004, the length of via barrel 126 may be approximately 8 mils, the length of via stub 126 may be approximately 10 mils, and the length of residual metal 202 may be approximately 25 mils. Additionally, the total thickness of PCB 100 may be 200 mils, the width of the vias 114, 116, 118, and 120 may be approximately 10 mils, and the width of the back drilled holes 128 and 130 may be approximately 12 mils. Based on these exemplary values, processor 142 of flying probe 140 may determine a delta capacitance of less than 20 fF between vias 114 and 116, a delta capacitance of 50 fF between vias 114 and 118, a delta capacitance of less than 20 fF between vias 114 and 120, a delta capacitance of 50 fF between vias 116 and 118, a delta capacitance of less than 20 fF between vias 116 and 120, and a delta capacitance of 50 fF between vias 118 and 120. Based on these exemplary delta capacitances, processor 142 of flying probe 140 may detect a possible stripping issue with respect to via 118 and back drilled hole 130. This detection may be made based on all of delta capacitances including via 118 being approximately 50 fF which is greater than the threshold value of 20 fF.

In FIG. 3, back drilled hole 130 may have an offset angle substantially equal to 2.5 degrees. In this exemplary embodiment, the threshold delta capacitance for detecting a possible stripping issue may be 20 fF. In this example, the dielectric constant (Dk/Df) for insulating layers 112 may be 3.2/0.004, the length of via barrel 126 may be approximately 8 mils, the length of via stub 126 may be approximately 10 mils, and the length of residual metal 202 may be approximately 85.7 mils. Additionally, the total thickness of PCB 100 may be 200 mils, the width of the vias 114, 116, 118, and 120 may be approximately 10 mils, and the width of the back drilled holes 128 and 130 may be approximately 12 mils. Based on these exemplary values, processor 142 of flying probe 140 may determine a delta capacitance of less than 20 fF between vias 114 and 116, a delta capacitance of 140 fF between vias 114 and 118, a delta capacitance of less than 20 fF between vias 114 and 120, a delta capacitance of 140 fF between vias 116 and 118, a delta capacitance of less than 20 fF between vias 116 and 120, and a delta capacitance of 140 fF between vias 118 and 120. Based on these exemplary delta capacitances, processor 142 of flying probe 140 may detect a possible stripping issue with respect to via 118 and back drilled hole 130. This detection may be made based on all of delta capacitances including via 118 being approximately 140 fF which is greater than the threshold value of 20 fF. In response to the possible stripping issue being detected, processor 142 of flying probe 140 may provide an individual with a notification of the possible stripping issue.

Figure 4:
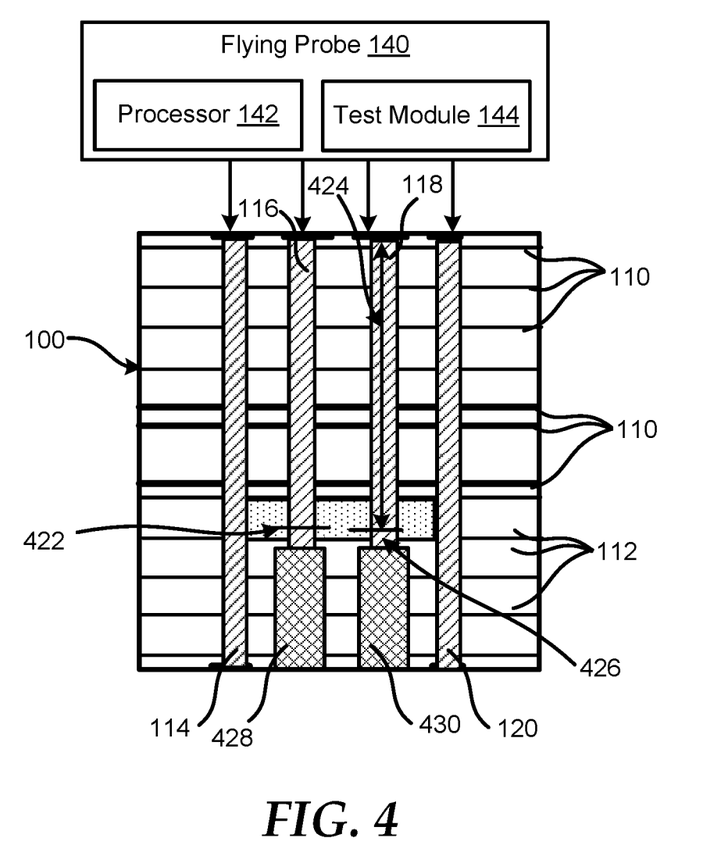
Figure 5:
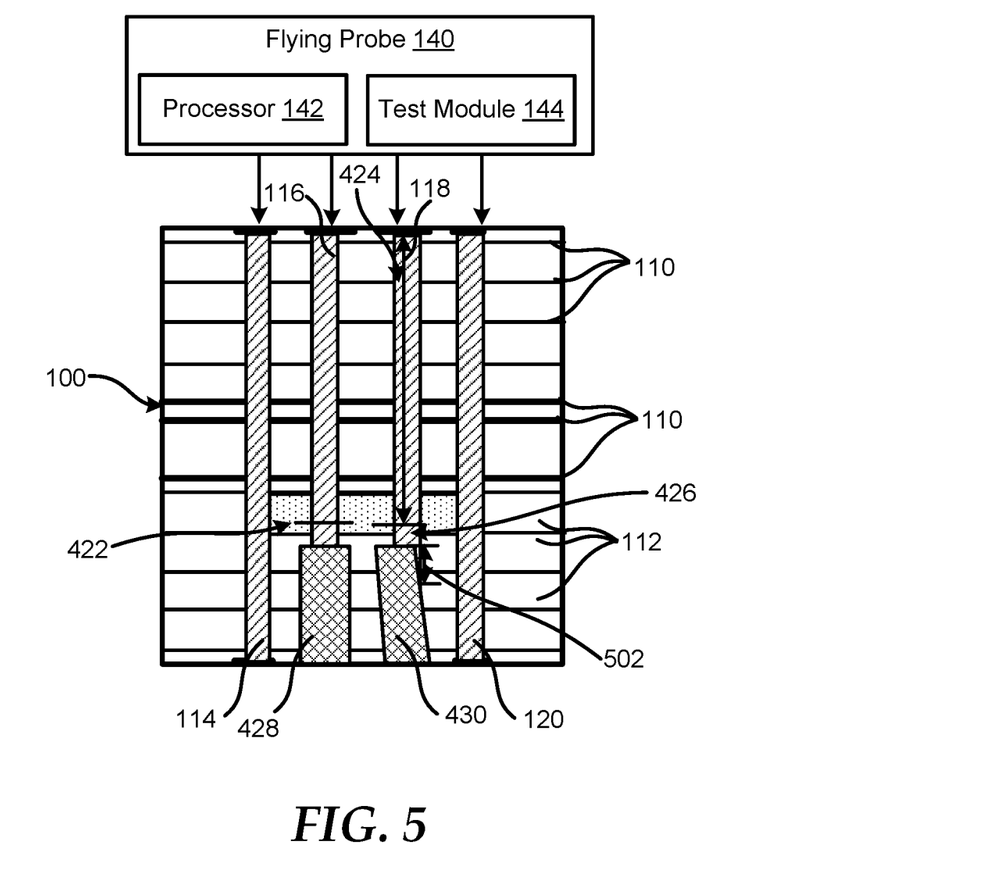

Referring now to FIGS. 4 and 5, vias 116 and 118 may connect with a component layer 422 within PCB 100. When vias 116 and 118 connect from a surface of PCB 100 to component layer 422, a portion of each via between a first surface and the component layer may be referred to as a via barrel 424 and a portion of each via that extends beyond the component layer toward a second surface may be referred to as a via stub 426.

In certain examples, a back drill process may be utilized to create back drilled holes 428 and 430 to remove or eliminate extra metal of the via, such as via stub 126, that extends beyond component layer 122. In an example, back drilled holes 428 and 430 may be utilized to only leave via stub 426 with a length that is less than 10 mils.

Referring now to FIG. 5, during the back drilling process, the drilling of one or both of back drilled holes 428 and 430 may be misaligned based on the drill being mis-registered with respect to a perpendicular angle with a surface of PCB 100. In response to the mis-registration of the drill, a back drilled hole, such as back drilled hole 430 may not remove all of the metal plating of via 118, such that a residual metal 502 amount or length of the metal may remain on the via. In an example, via striping from residual metal 502 may act as an additional length to via stub 426, which may greatly impact SI loss and impedance for high speed signals traveling along component layer 422 and via 118.

In FIG. 5, back drilled hole 430 may have an offset angle substantially equal to 7.4 degrees. In this exemplary embodiment, the threshold delta capacitance for detecting a possible stripping issue may be 20 fF. In this example, the dielectric constant (Dk/Df) for insulating layers 112 may be 3.2/0.004, the length of via barrel 426 may be approximately 130 mils, the length of via stub 426 may be approximately 10 mils, and the length of residual metal 502 may be approximately 25 mils. Additionally, the total thickness of PCB 100 may be 200 mils, the width of the vias 114, 116, 118, and 120 may be approximately 10 mils, and the width of the back drilled holes 128 and 130 may be approximately 12 mils. Based on these exemplary values, processor 142 of flying probe 140 may determine a delta capacitance of less than 20 fF between vias 114 and 116, a delta capacitance of 20 fF between vias 114 and 118, a delta capacitance of less than 20 fF between vias 114 and 120, a delta capacitance of 20 fF between vias 116 and 118, a delta capacitance of less than 20 fF between vias 116 and 120, and a delta capacitance of 20 fF between vias 118 and 120. Based on these exemplary delta capacitances, processor 142 of flying probe 140 may detect a possible stripping issue with respect to via 118 and back drilled hole 130. This detection may be made based on all of delta capacitances including via 118 being approximately 20 fF which is equal the threshold value of 20 fF.

Figure 6:
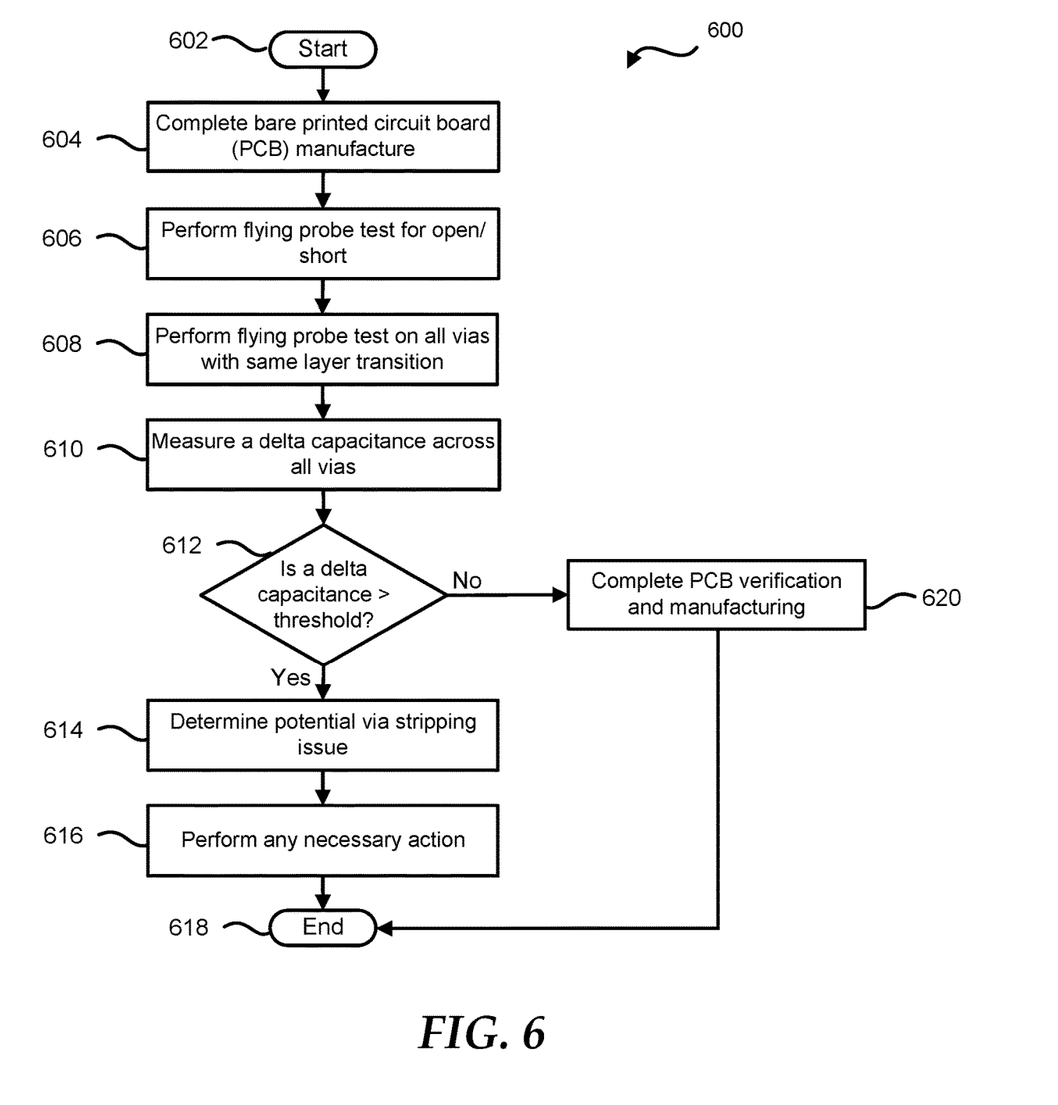
FIG. 6 is a flow diagram of method for detecting a via stripping issue in a printed circuit board according to at least one embodiment of the present disclosure.

FIG. 6 is a flow diagram of method 600 for detecting a via stripping issue in a printed circuit board according to at least one embodiment of the present disclosure, starting a block 602. It will be readily appreciated that not every method step set forth in this flow diagram is always necessary, and that certain steps of the methods may be combined, performed simultaneously, in a different order, or perhaps omitted, without varying from the scope of the disclosure. FIG. 6 may be employed in whole, or in part, any other type of controller, device, module, processor, or any combination thereof, operable to employ all, or portions of, the method of FIG. 6.

At block 604, a bare metal PCB manufacture is completed. In an example, the bare metal PCB manufacture of PCB may include any state of the PCB before components are added to a surface of the PCB. For example, the bare metal PCB may include multiple metal layers and each set of adjacent metal layers may be separated by respective insulating layers. The bare metal PCB may also include multiple vias to connect one or more metal layers within the PCB. In an example, one or more vias may extend beyond a component layer, such as a ball grid array or connector, within the PCB, and the extension of the via may result in a via stub. The via stub may adversely impact SI of high speed signal within the PCB. The bare metal PCB may include one or more back drilled holes to remove extra metal of the via that extends beyond the component layer. In an example, a goal of a back drilled hole operation may be to only leave via a stub that is less than 10 mils for PCIe interfaces.

At block 606, a flying probe test is performed to determine open/short and resistance conditions within the bare metal PCB. At block 608, a flying probe test is performed on all vias having a same layer transition. In an example, the flying probe may be utilized to detect capacitances of vias within the PCB. In certain examples, a flying probe may detect a large range of capacitance, such as a capacitance as low as 20 fF and as high as 20 nF. The details of utilizing a flying probe to detect capacitance are known in the art and will not be further described herein, except as needed to illustrate the current embodiments.

At block 610, delta capacitances, or capacitance difference, are measured across all vias. In an example, the delta capacitances may be measure by a test module of flying probe. PCB may include includes first, second, third, and fourth vias. In an example, a different delta capacitance may be measured between different pairs of vias. In certain examples, the delta capacitance may be measured based on the test module comparing a first capacitance associated with one via of a pair vias and a second capacitance associated with the other via of the pair of vias. For example, a first delta capacitance may be measured between the first and second vias, a second delta capacitance may be measured between the first and third vias, a third delta capacitance may be measured between the first and fourth vias, a fourth delta capacitance may be measured between the second and third vias, a fifth delta capacitance may be measured between the second and fourth vias, and a sixth delta capacitance may be measured between the third and fourth vias.

At block 612, a determination is made whether at least one of the delta capacitances is above a threshold value. In certain examples, the determination may be made by a processor of a flying probe. In an example, the threshold value may be any suitable capacitance including, but not limited to, 20 fF, 25 fF, and 30 fF. If at least one of the delta capacitances is above the threshold value, a potential via stripping issue is determined at block 614. At block 616, any necessary action is performed and the flow ends at block 618. In an example, the necessary action may include, but is not limited to, providing a notification to an individual on a display device, storing the possible or potential via stripping issue in a memory, and providing a list of actions to correct the potential via stripping issue on a display device, such as video display 734 of FIG. 7.

If at block 612, none of the delta capacitances is above the threshold value, PCB verification and manufacturing are completed at block 620, and the flow ends at block 618. In an example, the verification and manufacturing completion may be any suitable operations. For example, the verification and manufacturing completion may include, but are not limited to, back drilled hole checking, warpage testing, surface finishing, visual inspection, and shipment of the PCB.

FIG. 7 illustrates a generalized embodiment of an information handling system 700. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 700 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 700 can include processing resources for executing machine-executable code, such as a central processing unit (CPU), a programmable logic array (PLA), an embedded device such as a System-on-a-Chip (SoC), or other control logic hardware. Information handling system 700 can also include one or more computer-readable medium for storing machine-executable code, such as software or data. Additional components of information handling system 700 can include one or more storage devices that can store machine-executable code, one or more communications ports for communicating with external devices, and various input and output (I/O) devices, such as a keyboard, a mouse, and a video display. Information handling system 700 can also include one or more buses operable to transmit information between the various hardware components.

Information handling system 700 can include devices or modules that embody one or more of the devices or modules described below, and operates to perform one or more of the methods described below. Information handling system 700 includes a processors 702 and 704, an input/output (I/O) interface 710, memories 720 and 725, a graphics interface 730, a basic input and output system/universal extensible firmware interface (BIOS/UEFI) module 740, a disk controller 750, a hard disk drive (HDD) 754, an optical disk drive (ODD) 756, a disk emulator 760 connected to an external solid state drive (SSD) 762, an I/O bridge 770, one or more add-on resources 774, a trusted platform module (TPM) 776, a network interface 780, a management device 790, and a power supply 795. Processors 702 and 704, I/O interface 710, memory 720, graphics interface 730, BIOS/UEFI module 740, disk controller 750, HDD 754, ODD 756, disk emulator 760, SSD 762, I/O bridge 770, add-on resources 774, TPM 776, and network interface 780 operate together to provide a host environment of information handling system 700 that operates to provide the data processing functionality of the information handling system. The host environment operates to execute machine-executable code, including platform BIOS/UEFI code, device firmware, operating system code, applications, programs, and the like, to perform the data processing tasks associated with information handling system 700.

In the host environment, processor 702 is connected to I/O interface 710 via processor interface 706, and processor 704 is connected to the I/O interface via processor interface 708. Memory 720 is connected to processor 702 via a memory interface 722. Memory 725 is connected to processor 704 via a memory interface 727. Graphics interface 730 is connected to I/O interface 710 via a graphics interface 732, and provides a video display output 736 to a video display 734. In a particular embodiment, information handling system 700 includes separate memories that are dedicated to each of processors 702 and 704 via separate memory interfaces. An example of memories 720 and 730 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 740, disk controller 750, and I/O bridge 770 are connected to I/O interface 710 via an I/O channel 712. An example of I/O channel 712 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 710 can also include one or more other I/O interfaces, including an Industry Standard Architecture (ISA) interface, a Small Computer Serial Interface (SCSI) interface, an Inter-Integrated Circuit (I2C) interface, a System Packet Interface (SPI), a Universal Serial Bus (USB), another interface, or a combination thereof. BIOS/UEFI module 740 includes BIOS/UEFI code operable to detect resources within information handling system 700, to provide drivers for the resources, initialize the resources, and access the resources. BIOS/UEFI module 740 includes code that operates to detect resources within information handling system 700, to provide drivers for the resources, to initialize the resources, and to access the resources.

Disk controller 750 includes a disk interface 752 that connects the disk controller to HDD 754, to ODD 756, and to disk emulator 760. An example of disk interface 752 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 760 permits SSD 764 to be connected to information handling system 700 via an external interface 762. An example of external interface 762 includes a USB interface, an IEEE 1394 (Firewire) interface, a proprietary interface, or a combination thereof. Alternatively, solid-state drive 764 can be disposed within information handling system 700.

I/O bridge 770 includes a peripheral interface 772 that connects the I/O bridge to add-on resource 774, to TPM 776, and to network interface 780. Peripheral interface 772 can be the same type of interface as I/O channel 712, or can be a different type of interface. As such, I/O bridge 770 extends the capacity of I/O channel 712 when peripheral interface 772 and the I/O channel are of the same type, and the I/O bridge translates information from a format suitable to the I/O channel to a format suitable to the peripheral channel 772 when they are of a different type. Add-on resource 774 can include a data storage system, an additional graphics interface, a network interface card (NIC), a sound/video processing card, another add-on resource, or a combination thereof. Add-on resource 774 can be on a main circuit board, on separate circuit board or add-in card disposed within information handling system 700, a device that is external to the information handling system, or a combination thereof.

Network interface 780 represents a NIC disposed within information handling system 700, on a main circuit board of the information handling system, integrated onto another component such as I/O interface 710, in another suitable location, or a combination thereof. Network interface device 780 includes network channels 782 and 784 that provide interfaces to devices that are external to information handling system 700. In a particular embodiment, network channels 782 and 784 are of a different type than peripheral channel 772 and network interface 780 translates information from a format suitable to the peripheral channel to a format suitable to external devices. An example of network channels 782 and 784 includes InfiniBand channels, Fibre Channel channels, Gigabit Ethernet channels, proprietary channel architectures, or a combination thereof. Network channels 782 and 784 can be connected to external network resources (not illustrated). The network resource can include another information handling system, a data storage system, another network, a grid management system, another suitable resource, or a combination thereof.

Management device 790 represents one or more processing devices, such as a dedicated baseboard management controller (BMC) System-on-a-Chip (SoC) device, one or more associated memory devices, one or more network interface devices, a complex programmable logic device (CPLD), and the like, that operate together to provide the management environment for information handling system 700. In particular, management device 790 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 700, such as system cooling fans and power supplies. Management device 790 can include a network connection to an external management system, and the management device can communicate with the management system to report status information for information handling system 700, to receive BIOS/UEFI or system firmware updates, or to perform other task for managing and controlling the operation of information handling system 700. Management device 790 can operate off of a separate power plane from the components of the host environment so that the management device receives power to manage information handling system 700 when the information handling system is otherwise shut down. An example of management device 790 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 790 may further include associated memory devices, logic devices, security devices, or the like, as needed or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A flying probe comprising:
    a test module configured to measure a plurality of delta capacitances associated with a plurality of vias in a printed circuit board, the plurality of vias including first, second, third and fourth vias, wherein each different delta capacitance is a capacitance difference between a different pair of the vias and each different delta capacitance is measured between the different pair of the vias; and
    a processor configured to communicate with the test module, the processor to:
        compare all the delta capacitances to a threshold value; and
        in response to multiple delta capacitances associated with the first via being greater than or equal to the threshold value, detect a possible via stripping issue for the first via.

2. The flying probe of claim 1, wherein the test module further to measure a first capacitance associated with the first via and a second capacitance associated with the second via, wherein the first capacitance is effected by a first portion of the first via is a first via stub that extends below a component layer of the printed circuit board, and wherein the second capacitance is effected by a second portion of the second via is a second via stub that extends below the component layer.

3. The flying probe of claim 1, wherein the multiple delta capacitances associated with the first via are greater than or equal to the threshold value based on a residue of metal remaining along the first via.

4. The flying probe of claim 3, wherein the multiple delta capacitances associated with the first via increase as a length of the residual metal increases.

5. The flying probe of claim 3, wherein the residue of metal is created based on a misalignment of a drill to create the first back drilled hole.

6. The flying probe of claim 3, wherein the second back drill hole removes an entire amount of the second via below the second portion of the second via.

7. The flying probe of claim 1, wherein a first delta capacitance is measured between the first and second vias, a second delta capacitance is measured between the first and third vias, a third delta capacitance is measured between the first and fourth vias, a fourth delta capacitance is measured between the second and third vias, a fifth delta capacitance is measured between the second and fourth vias, and a sixth delta capacitance is measured between the third and fourth vias.

8. A flying probe comprising:
a test module configured to measure a plurality of delta capacitances associated with a plurality of vias in a printed circuit board, the plurality of vias including first, second, third and fourth vias, wherein each different delta capacitance is a capacitance difference between a different pair of the vias and each different delta capacitance is measured between the different pair of the vias; and
a processor configured to communicate with the test module, the processor to:
compare all the delta capacitances to a threshold value;
in response to multiple delta capacitances associated with the first via being greater than or equal to the threshold value, detect a possible via stripping issue for the first via; and
in response to the detection of the possible via stripping issue for the first via, provide a list of actions to correct the potential via stripping issue on a display device.

9. The flying probe of claim 8, wherein the test module further to measure a first capacitance associated with the first via and a second capacitance associated with the second via, wherein the first capacitance is effected by a first portion of the first via is a first via stub that extends below a component layer of the printed circuit board, and wherein the second capacitance is effected by a second portion of the second via is a second via stub that extends below the component layer.

10. The flying probe of claim 8, wherein the multiple delta capacitances associated with the first via are greater than or equal to the threshold value based on a residue of metal remaining along the first via.

11. The flying probe of claim 10, wherein the multiple delta capacitances associated with the first via increase as a length of the residual metal increases.

12. The flying probe of claim 10, wherein the residue of metal is created based on a misalignment of a drill to create the first back drilled hole.

13. The flying probe of claim 10, wherein the second back drill hole removes an entire amount of the second via below the second portion of the second via.

14. The flying probe of claim 10, wherein a first delta capacitance is measured between the first and second vias, a second delta capacitance is measured between the first and third vias, a third delta capacitance is measured between the first and fourth vias, a fourth delta capacitance is measured between the second and third vias, a fifth delta capacitance is measured between the second and fourth vias, and a sixth delta capacitance is measured between the third and fourth vias.

15. A method comprising:
measuring, by a test module of a flying probe, a plurality of delta capacitances associated with a plurality of vias within a printed circuit board of an information handling system, wherein each different delta capacitance is a capacitance difference between a different pair of the vias and each different delta capacitance is measured between the different pair of the vias;
comparing, by a processor of the flying probe, all the delta capacitances to a threshold value; and
in response to multiple delta capacitances associated with a first via being greater than or equal to the threshold value, detecting, by the processor, a possible via stripping issue for the first via.

16. The method of claim 15, further comprising:
in response to the detection of the possible via stripping issue for the first via, providing a list of actions to correct the potential via stripping issue on a display device.

17. The method of claim 15, wherein the multiple delta capacitances associated with the first via are greater than or equal to the threshold value based on a residue of metal remaining along the first via from a back drilled hole.

18. The method of claim 17, wherein the multiple delta capacitances associated with the first via increase as a length of the residual metal increases.

19. The method of claim 17, wherein the residue of metal is created based on a misalignment of a drill to create the first back drilled hole.

20. The method of claim 15, wherein a first delta capacitance is measured between the first and second vias, a second delta capacitance is measured between the first and third vias, a third delta capacitance is measured between the first and fourth vias, a fourth delta capacitance is measured between the second and third vias, a fifth delta capacitance is measured between the second and fourth vias, and a sixth delta capacitance is measured between the third and fourth vias.

* * * * *